US007459681B2

(12) United States Patent
Arai et al.

(10) Patent No.: US 7,459,681 B2
(45) Date of Patent: Dec. 2, 2008

(54) SCANNING ELECTRON MICROSCOPE

(75) Inventors: Noriaki Arai, Hitachinaka (JP); Makoto Ezumi, Mito (JP); Yoichi Ose, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 271 days.

(21) Appl. No.: 10/566,634

(22) PCT Filed: Aug. 10, 2005

(86) PCT No.: PCT/JP2005/014677

§ 371 (c)(1),
(2), (4) Date: Aug. 31, 2006

(87) PCT Pub. No.: WO2006/016613

PCT Pub. Date: Feb. 16, 2006

(65) Prior Publication Data
US 2007/0057183 A1    Mar. 15, 2007

(30) Foreign Application Priority Data
Aug. 11, 2004    (JP) ............................. 2004-234324

(51) Int. Cl.
*H01J 37/28* (2006.01)
*H01J 37/00* (2006.01)
*G21K 5/08* (2006.01)

(52) U.S. Cl. ................... 250/306; 250/310; 250/396 R; 250/397; 250/398

(58) Field of Classification Search ................. 250/306, 250/310, 396 R, 397, 398
See application file for complete search history.

(56) References Cited

U.S. PATENT DOCUMENTS 6,555,815 B2    4/2003    Feuerbaum et al.
(Continued)

FOREIGN PATENT DOCUMENTS

JP    59-155941 A    9/1984
(Continued)

OTHER PUBLICATIONS

David C Joy, "A Database of Electron-Solid Interactions," Compiled by David C Joy, 2001.

*Primary Examiner*—Nikita Wells
(74) *Attorney, Agent, or Firm*—Dickstein Shapiro LLP

(57) ABSTRACT

An object of the invention is to reduce the beam drift in which the orbit of the charged particle beam is deflected by a potential gradient generated by a nonuniform sample surface potential on a charged-particle-beam irradiation area surface, the nonuniform sample surface potential being generated by electrification made when observing an insulating-substance sample using a charged particle beam.

Energy of the charged particle beam to be irradiated onto the sample is set so that generation efficiency of secondary electrons generated from the sample becomes equal to 1 or more. A flat-plate electrode (26) is located in such a manner as to be directly opposed to the sample. Here, the flat-plate electrode is an electrode to which a voltage can be applied independently, and which is equipped with a hole through which a primary charged particle beam can pass. Furthermore, a voltage can be applied independently to a sample stage (12) on which the sample is mounted. Here, the sample stage's surface directly opposed to the sample is formed into a planarized structure with no projections and depressions thereon. Also, diameter D of the hole provided in the flat-plate electrode (26) and distance L between the flat-plate electrode (26) and the sample are set such that a relation of $D/L \leq 1.5$ is satisfied.

15 Claims, 10 Drawing Sheets

U.S. PATENT DOCUMENTS

| | | | |
|---|---|---|---|
| 6,972,412 B2 * | 12/2005 | Scholtz et al. | 250/396 R |
| 2007/0194232 A1 * | 8/2007 | Nagahama et al. | 250/310 |
| 2008/0121803 A1 * | 5/2008 | Shojo et al. | 250/307 |

FOREIGN PATENT DOCUMENTS

| | | | |
|---|---|---|---|
| JP | 62-110245 A | 5/1987 | |
| JP | 1-229977 A | 9/1989 | |
| JP | 5-174768 A | 7/1993 | |
| JP | 8-68772 A | 3/1996 | |
| JP | 8-22176 A | 8/1996 | |
| JP | 09171791 A | 6/1997 | |
| JP | 9-283072 A | 10/1997 | |
| JP | 9-304040 A | 11/1997 | |
| JP | 9-320505 A | 12/1997 | |
| JP | 10-172493 A | 6/1998 | |
| JP | 10-312765 A | 11/1998 | |
| JP | 2000-36273 A | 2/2000 | |
| JP | 2000-40481 A | 2/2000 | |
| JP | 2000-277049 A | 10/2000 | |
| JP | 2001-26719 A | 1/2001 | |
| JP | 2001-52642 A | 2/2001 | |
| JP | 2002-131887 A | 5/2002 | |
| JP | 2002-203774 A | 7/2002 | |
| JP | 2002-250707 A | 9/2002 | |
| JP | 2004-14485 A | 1/2004 | |

* cited by examiner

SCANNING ELECTRON MICROSCOPE

TECHNICAL FIELD

The present invention relates to a control technique for controlling electrification. This electrification turns out to become a problem when observing an insulating-substance sample in devices which use a charged particle beam as the probe. Examples of such devices are a scanning electron microscope (SEM) and a focused-ion-beam (FIB) machining and observation device. Also, it is highly likely that electric charges will be accumulated on glass-substrate samples by irradiation with the charged particle beam. Examples of such glass-substrate samples are a reticle (i.e., mask) and a quartz wafer. Accordingly, in particular, the present invention relates to a technique for allowing a pattern configured on the glass-substrate samples to be stably length-measured using the charged particle beam devices.

BACKGROUND ART

In the SEM observation of an insulating-substance composed sample by using a charged particle beam, the main object and concern has been placed on elimination or neutralization of the electrification which turns out to become the problem. In order to accomplish this object, the following techniques and units have been disclosed so far, for example: A technique for converting an insulating-substance sample into electrically conductive property by forming an electrically conductive layer on the insulating-substance sample by a method such as evaporation (Patent Document 1), a technique for neutralizing the electrification on the insulating-substance sample by providing an irradiation unit of beams such as an electron beam or positive and negative ion beams independently of a primary charged particle beam which is irradiated onto the sample for forming the image (Patent Documents 2 and 3), a technique for neutralizing the electrification by providing a plasma irradiating unit inside a sample chamber or outside the sample chamber (Patent Document 4), a unit for maintaining the inside of the sample chamber under low vacuum (Patent Documents 5, 6, and 7), a technique for neutralizing the electrification by providing a gas locally-introducing unit (Patent Document 8) to ionize the gaseous molecules by the primary charged particle beam, and further, a technique for converting the insulating-substance sample into the electrically conductive property by irradiating short-wavelength light such as ultraviolet rays onto the electrified area (Patent Documents 9 and 10). Any of the above-cited techniques and units, however, has the following drawbacks: An on-the-spot observation is impossible to make, the throughput is low, the device control is complicated, the resolution is low, the maintenance is difficult and the period is short, a photosensitive material such as resist is unsuitable therefor, and the like.

Meanwhile, as a technique similar to the configuration of the present invention, a defect inspection method for an insulating-film sample in the SEM has been disclosed in Patent Document 11. This defect inspection method is as follows: Namely, an electrode is located in a manner of being directly opposed to the sample, then applying an appropriate electric voltage thereto. This voltage allows low-energy secondary electrons generated from the sample to be fed back to the sample, thereby making it possible to stabilize the electrification at a constant potential. Accordingly, it has been publicly known that the electrification can be relaxed by using the secondary electrons via the operation of the electrode. This technique, however, is an invention belonging to the era where the device size was larger. Moreover, the electron-beam irradiation area in question is also larger than the one in the present invention. Namely, the effect which this technique brings about is, after all, an effect of roughly suppressing an in-elapsed-time increase in positive electrification on the insulating film. This technique is also a one which was used afterwards for the potential contrast control over a circuit inspection device called "EB tester". After all, this technique differs from the present invention in its objects and effects. In the present invention, controls to be implemented are as follows:

A control over local displacement of the electrification charges, a control over the beam drift whose velocity is equal to a few nm/s and which is caused by the potential gradient on the insulating-substance sample, and a dynamic control over the electrode voltage where attention is focused on an intentional control over the potential barrier. These controls and phenomena turn out to become problems when making a high-magnification and high-accuracy length-measurement just like in the present invention.

Also, in Patent Document 12 and Patent Document 13, disclosures have been made concerning observation methods for the insulating-substance sample. The observation methodologies described in the above-described Documents are as follows: Here, in general, the retarding method is a high-resolution implementation methodology for the SEM where a primary electron beam with high energy supplied is caused to pass through within a lens field which functions as a deceleration potential against the primary electron beam. In the device where the retarding method is used for a sample or a sample stage, an electrode is located at a position above the sample or in such a manner as to cover the sample, then applying thereto a voltage which is equal to the retarding voltage. This voltage allows the sample to be positioned within an electric-field-absent environment, thereby controlling the insulating-substance sample surface at an arbitrary potential. Otherwise, in the device which uses the retarding method, an auxiliary electrode is added with an object of improving yield quantity of the secondary electrons. These methodologies, however, differ from the present invention in the following points: Namely, the control over the electrification and a reduction in the beam drift are not regarded as their object, and such an effect itself cannot be expected.

Moreover, in Patent Document 14, a disclosure has been made concerning the following configuration: In the SEM which uses the retarding method, an objective-lens polar segment is located, and also an intermediate electrode is located at a position above the objective-lens polar segment. The intermediate electrode is a technique for neutralizing the electrification of a sample by applying a negative bias to the objective-lens polar segment to cause the secondary electrons generated from the sample to be fed back to the sample. However, the present configuration itself has been disclosed in the above-described Patent Document 13. Also, the principle and the phenomena have been disclosed in the above-described Patent Document 11. Accordingly, since the effect of the sample stage lacks in the conventional techniques, it is impossible to make uniform the potential gradient on the sample surface. Simultaneously, with the contents disclosed as the present configuration, it is difficult to implement the stabilization of the electrification on the insulating-substance sample, and the inspection and length-measurement in the high magnification where the beam drift turns out to become the problem. Consequently, no concrete solving unit or method has been disclosed for these problems.

Patent Document 1: JP-A-8-68772
Patent Document 2: JP-A-8-222176
Patent Document 3: JP-A-10-172493
Patent Document 4: JP-A-2002-131887
Patent Document 5: JP-A-9-304040
Patent Document 6: JP-A-5-174768
Patent Document 7: JP-A-2002-203774
Patent Document 8: US-P-6555815B2
Patent Document 9: JP-A-2000-36273
Patent Document 10: JP-A-10-312765
Patent Document 11: JP Pat.2130001
Patent Document 12: JP-A-09-171791
Patent Document 13: JP-A-2001-026719
Patent Document 14: JP-A-2002-250707
Non-Patent Document 1: A DATABASE OF ELECTRON-SOLID INTERACTIONS David C Joy, EM Faculty, University of Tennessee, and Oak Ridge National Laboratory

DISCLOSURE OF THE INVENTION

Problem To Be Solved By The Invention

It is an object of the present invention to perform a high-resolution, excellent-accuracy, and excellent-reproducibility length-measurement of a structure on a sample by using a charged particle beam. This sample is assumed to be a kind of sample on the surface of which an insulating substance is partially exposed, or whose substrate is formed of an insulating substance. Accomplishing this object requires that the following problems be overcome:

The first problem is the so-called "a reduction in the beam drift". The beam drift is the following phenomenon: Namely, when observing an insulating-substance sample using a charged particle beam, electrification is induced. Moreover, this electrification makes a sample surface potential nonuniform within a charged-particle-beam irradiation area surface. This nonuniformity causes a potential gradient to occur. Eventually, the orbit of the charged particle beam is deflected by this potential gradient.

Also, as is known as a physical phenomenon, because of the electrification which has occurred on the sample, if this electrification assumes a positive polarity, a potential will be formed directly above an electrified location. This potential turns out to become a potential barrier which is exerted against energy of secondary electrons generated from the electrified location. As a result, there occurs the self-relaxation effect that the low-energy secondary electrons emitted from the electrified location will be fed back to the sample surface then to lower the electrification quantity. Even if the length-measurement location or the sample to be length-measured has been changed, as long as the electrification quantity can be reduced enough as compared with an initial electrification quantity, it is possible to reduce an error of the length-measurement accuracy down to a level which is of no problem from the practical standpoint. Also, if the electrification has been vanished completely, it becomes impossible to clarify differences in the material and structure by using the potential contrast. Accordingly, controlling the electrification quantity is also important. It is highly unlikely, however, that the secondary electrons will be fed back to the electrified area uniformly. Also, unless the self-relaxation effect itself is under an appropriate condition, the electrification quantity remains large even if a considerable long time has elapsed. As a result, the sample surface potential remains nonuniform.

Consequently, the second problem is to provide a unit and a condition which allow the self-relaxation effect of the electrification to be performed effectively.

Moreover, after overcoming the first and second problems, the third problem is to provide a device which allows implementation of a high-resolution image observation.

Means For Solving The Problems

Energy of the charged particle beam to be irradiated onto the sample is set so that generation efficiency of the secondary electrons generated from the sample becomes equal to 1 or more. Configuration of the device is as follows: A flat-plate electrode is located in such a manner as to be directly oppose to the sample. Here, the flat-plate electrode is an electrode to which a voltage can be applied independently, and which is equipped with a hole through which the primary charged particle beam can pass. Moreover, a voltage can be applied independently to a sample stage on which the sample is mounted. Here, the sample stage's surface directly opposed to the sample is formed into a planarized structure with no projections and depressions thereon. Also, diameter D of the hole provided in the flat-plate electrode and distance L between the flat-plate electrode and the sample are set such that a relation of $D/L \leq 1.5$ is satisfied. Furthermore, a positive voltage which is equal to a few V to a few tens of V relative to the sample surface potential is applied to the flat-plate electrode so that the induced electrification will not be accumulated in excess, and so as to perform the detection of the secondary electrons. In addition, as a pre-stage for the length-measurement, the voltage to be applied to the flat-plate electrode is changed from the predetermined initial value to an a-few-V to a-few-tens-of-V negative voltage while irradiating the primary charged particle beam. After that, the length-measurement is performed.

Advantages Of The Invention

According to the device configuration of the present invention, it becomes possible to eliminate the potential gradient on an insulating-substance sample surface, and to perform high-speed relaxation and stabilization of the electrification induced when a charged particle beam is irradiated onto the insulating-substance sample. Even in the high magnification under which the length-measurement is performed, it becomes possible to stabilize the S/N ratio and contrast, and to eliminate the beam drift as well. As a result, it becomes possible to perform the length-measurement of an insulating-substance sample with a high resolution, an excellent accuracy, and an excellent reproducibility. Moreover, it is possible to automatically set the flat-plate electrode voltage for stabilizing the electrification. This characteristic allows optimum conditions to be set even in various types of samples whose electrification quantities differ from each other, thereby making it possible to perform length-measurements of the insulating-substance samples regardless of the differences in the samples or technical competencies of operators.

The other objects, characteristics, and advantages of the present invention will become apparent from the following description of embodiments of the present invention accompanied by the accompanying drawings.

Best Mode For Carrying Out The Invention

First, referring to FIG. 1, the explanation will be given below concerning a representative embodiment of the present invention. The present embodiment is of the basic configuration of a scanning electron microscope (SEM) which uses the retarding method. The whole or a part of configuration components 1 to 12 of the present embodiment is contained within a vacuum container. The electron source 1 is the so-called "Schottky electron source", i.e., an electron source where zirconium oxide is coated and diffused on a needle-shaped-machined tungsten thereby to decrease the work function of an electron emission portion at the electron source front-end. The electron source 1 is heated at a proper temperature by a constant current power-supply 15 which is kept floating over an electron-gun acceleration power-supply 18 for applying an electron-beam initial acceleration voltage −3 kV to the electron source. Then, electron emission is performed at an extraction electrode 3 to which an extraction voltage power-supply 17 for performing the electron electric-field emission is connected. This makes it possible to acquire an emitted electron beam whose energy distribution width is narrow and whose emission current quantity is stable. Also, a power-supply 16 capable of applying a negative voltage to the electron-gun acceleration power-supply 18 is connected to a suppression electrode 2 set up in proximity to the electron source. This makes it possible to increase or decrease the emission current quantity.

A magnetic-field lens 4 and a magnetic-field lens 5, which have an effect of converging the electron beam, are set onto an optical condition which is preferable for the present embodiment. A deflection coil 8 allows the electron beam to scan on a sample 11 with a desired FOV (: Field Of View). Secondary electrons generated from the sample 11 are accelerated in the electron source 1's direction by an effect of magnetic field of an objective lens 9, and by effects of negative voltages which are respectively applied to a control electrode 10 and a metallic sample stage 12 by a control electrode power-supply 20 and a retarding power-supply 21. The secondary electrons are finally captured by a secondary-electron detector 13, then being electrically amplified thereby. After that, the amplified secondary electrons are subjected to an A/D conversion at an image processing unit 19. This makes it possible to display, on an image output terminal 14, a raster image which is synchronized with an electron-beam scan signal at the deflection coil. Although, in the present embodiment, an Everhart-Thornley type detector including a scintillator, a light guide, and a secondary-electron multiplier tube is used as the secondary-electron detector 13, a semiconductor detector or a micro channel plate may also be used.

Also, in the present embodiment, there is provided a conversion electrode 6 at the pre-stage of the secondary-electron detector 13. The conversion electrode 6 allows the secondary electrons or reflection electrons accelerated and ascending from the sample 11 to be converted into the low-speed secondary electrons once again. Simultaneously, there is provided an EXB filter 7. The EXB filter 7 exerts no influences on the orbit of the primary electron beam, and is capable of deflecting only the low-speed secondary electrons in the secondary-electron detector 13's direction. The set-up of the conversion electrode and the EXB filter configures the detection system whose secondary-electron collection efficiency is high.

A potential-blockage type energy filter (not illustrated) is provided within the EXB filter 7. This energy filter uses one or more pieces of mesh-like metallic electrodes, then applying thereto a voltage which is at basically the same level as the voltage applied to the sample stage 12 by the retarding power-supply 21. This voltage allows the energy filter to generate a potential barrier which is exerted against the energy of the secondary electrons generated and accelerated from the sample 11. On account of this potential barrier, it becomes possible to make the distinction between the reflection electrons and the secondary electrons, of course. In addition thereto, by providing a plurality of secondary-electron detectors 13, it also becomes possible to simultaneously acquire the reflection electrons and the secondary electrons, and to display them in a manner of being added to the SEM image with arbitrary proportions.

Furthermore, by making the blockage potential of the energy filter variable, it also becomes possible to measure the surface potential on the sample 11 caused by the electrification which is induced when the primary electron beam is irradiated on the sample 11. This allows a change in the optical magnification to be calculated using both an operation condition of the optical system and the surface potential. Consequently, if, from this result, resetting deflection current of the deflection coil 8 is carried out, accurate magnification setting becomes executable regardless of the electrification on the sample surface.

The configuration explained so far is the basic configuration as the SEM in the present embodiment. It is the object of the present invention to perform the stable length-measurement without being influenced by the electrification even if the sample 11 is a sample on the surface of which an insulating substance is partially exposed, or a sample whose substrate is formed of an insulating substance., e.g., a reticle (i.e., mask) or a liquid-crystal substance. Accordingly, the explanation will be given below concerning a configuration therefor.

The number of secondary electrons which are generated if a single electron enters the sample is defined as the secondary-electrons emission ratio δ. Then, in the case of $SiO_2$, as illustrated in FIG. 2, the secondary-electrons emission ratio δ changes depending on incident energy of the primary electron beam. Here, it has been known that the sample surface will be positively electrified if δ is larger than 1, and that the sample surface will be negatively electrified if δ is smaller than 1.

In the present embodiment, using substantially 1-KeV energy used in the ordinary low-acceleration SEM, the energy of the electron beam to be irradiated onto the sample is set so that the generation efficiency of the secondary electrons generated from the sample becomes equal to 1or more. Although the incident energy which is close to 50 eV may also be selected, the change in the secondary-electrons emission ratio relative to the incident energy is large and difficult to control. This is disadvantageous from the viewpoint of the resolution as well. Moreover, as will be described later, the selection of the incident energy corresponding to δ which is close to 1 will prove advantageous in points as well of stabilization of the electrification quantity and automatization of voltage setting to be applied to the control electrode 10.

Also, consider the case where an insulating-substance sample or in particular, a sample whose substrate is formed of glass, is located at an intermediate position between the control electrode 10 formed into a flat-plate electrode and the sample stage 12. Then, in this case, vacuum and the glass turn out to exist between the control electrode 10 and the sample stage 12. As a result, if a hole is large enough up to a degree that the potential generated by the components positioned in the electron source 1's direction of the control electrode 10 can permeate into a proximity to the sample from the hole, the potential turns out to penetrate into the sample whose permittivity is larger than that of the vacuum. Here, the above-described hole is a hole which is provided in the control electrode 10 and through which the primary electron beam can pass. This potential's penetration causes a warp in an equipotential surface to occur on the sample surface, thereby resulting in occurrence of a potential gradient within the sample surface.

In addition thereto, when the electrification charges are induced on the insulating-substance sample, the above-described potential gradient causes a displacement of the charges to occur. This charges' displacement further changes the potential gradient on the sample surface, thereby resulting in occurrence of the beam drift of the primary electron beam. This is a conceivable explanation of the reason for occurrence of the beam drift.

In the present embodiment, the control electrode 10, i.e., the flat-plate electrode, is located in such a manner as to be directly opposed to the sample 11. Here, the flat-plate electrode is an electrode to which the voltage can be independently applied by using the control electrode power-supply 20, and which is equipped with the hole. Also, the hole is the one through which the primary electron beam can pass, and which is located on an axis coinciding with the central axis of an objective-lens magnetic pole hole. Moreover, the retarding power-supply 21 makes it possible to independently apply the voltage to the sample stage 12 on which the sample 11 is mounted. Here, the sample stage's surface directly opposed to the sample 11 is formed into a planarized structure with no projections and depressions thereon. This allows the sample 11 to be sandwiched between the control electrode 10 and the sample stage 12.

On account of this configuration, the electric field between the control electrode 10 and the sample 11 becomes a parallel electric field. This condition permits the sample surface to be caused to coincide with the equipotential surface, thereby allowing elimination of the warp in the equipotential surface on the sample surface. Simultaneously, it becomes possible to arbitrarily set the equipotential surface by the voltages applied to the control electrode 10 and the sample stage 12.

Consequently, in the insulating-substance sample or in particular, in the sample whose substrate is formed of glass, it becomes possible to set the sample surface at a voltage. Here, this voltage can be accurately calculated using an electric-field simulation which uses the sample's permittivity, the voltages applied to the control electrode 10 and the sample stage 12, and their respective sizes.

Next, referring to FIG. 3A and FIG. 3B, the more detailed explanation will be given below concerning the formation of the equipotential surface. In addition to the retarding method, as one of the high-resolution implementation methodologies for the SEM, the boosting method exists. This boosting method is as follows: Namely, a positive high voltage is applied to the whole of a magnetic path or a part of the magnetic path which is isolated. This positive high voltage causes the electron beam to pass through within the lens field at a high speed, thereby reducing chromatic aberration. In FIG. 3A, a 5-kV boosting voltage is applied to the objective lens 9 by a boosting power-supply 25, and the retarding voltage is applied to the sample stage 12 by –2 kV. Also, a control electrode 22 is set at –1.9 kV.

FIG. 3A illustrates the control electrode 22. However, if there is provided none of the control electrode 22, or if a hole, which is provided in the center of the control electrode 22 and through which the primary electron beam can pass, is rather large as in the control electrode 22, the boosting voltage penetrates into the sample 11 from the hole, then forming an equipotential-line distribution 23. This indicates that the distribution 23 formed will cause a potential gradient to occur on the surface of the insulating-substance sample 11.

Meanwhile, FIG. 3B illustrates a state where the boosting voltage applied to the objective lens 9 is lowered, and where the hole diameter of the control electrode is made smaller as in a control electrode 26. In this case, as is indicated from an equipotential-line distribution 27, the distribution 27 has been planarized. This condition permits the surface of the sample 11 to be caused to coincide with the equipotential surface. Even if the boosting voltage continues to be set at the high voltage, this effect can also be acquired by making the hole diameter of the control electrode 26 even smaller, or by making the distance between the control electrode 26 and the sample 11 larger. These methods, however, result in an increase in the deflection curvature of the primary electron beam, or an exceeding lowering in the resolution.

Also, as an important element for allowing the present invention to be effectively carried out, structure of the sample stage 12 can be mentioned. FIG. 4A is a cross-sectional diagram of structure of a metallic sample stage 28 including the control electrode 10 when the reticle is selected as the sample. This is the case of a configuration where the insulating-substance sample 11 is embedded in the sample stage 28, and where the upper surface of the sample 11 and that of the sample stage 28 are configured to exist on one and the same flat plane. Support stages 24 are spacers for preventing the reticle from being brought into directly contact with the sample stage 28 so as not to damage the reticle. The support stages 24 are formed of a material which generates no foreign substances. Height of the support stages 24 exerts influences on a change ratio in the voltage which is exerted on the sample 11 at the time of a voltage change in the control electrode 10, i.e., the sensitivity. This will be explained later. Accordingly, there must not exist a variation in the height among the devices.

FIG. 4B, which is a part of FIG. 4A, illustrates an equipotential-line distribution in the case of observing an end portion of the sample 11. This is the case where a primary electron beam 29 is irradiated on a place which comes inwards by 5 mm from the sample end-portion. Incidentally, the condition is based on an example including a combination of the retarding voltage and the control-electrode voltage and the control-electrode location, i.e., a preferable example for carrying out the present invention effectively. Here, the retarding voltage is equal to –2100 V, the control-electrode voltage is equal to –2000 V, the distance between the control electrode 10 and the sample 11 is equal to 1 mm, the hole diameter of the control electrode 10 is equal to 1 mm, and the height of the support stages 24 is equal to 0.5 mm.

The resultant equipotential-line distribution turns out to become a distribution like an equipotential-line group 30. Then, if a dimension 31 is of basically the same order as thickness of the sample, a large difference will occur between a potential density formed between the control electrode 10 and the sample stage 28 and a potential density formed by the control electrode 10 and the sample 11. This will cause a large potential gradient to occur in the electron-beam irradiation location at the sample end-portion.

Meanwhile, FIG. 5A is a cross-sectional diagram of another embodiment of the sample stage. As illustrated in FIG. 5B, the dimension 31 is made smaller like a dimension 33. As a result, the resultant equipotential-line distribution turns out to become a distribution like an equipotential-line group 34. Accordingly, it becomes possible to eliminate the potential gradient which has occurred at the end portion of the sample 11, thereby being capable of suppressing the displacement of the electrification charges into a minimum value. Incidentally, basically the same processing as the dimension 33 is applicable not only to the depth of the illustrated depression of a sample stage 32, but also to heights of structures to be located on the periphery of the sample 11 on the sample stage 32. In view of the factors preferable for the present invention, such as the voltage condition, the position of the control electrode 10, and the height of the support stages 24, it is desirable that the dimension 33 be made smaller than one-half of the sample thickness.

As having been described so far, based on the consideration of the potential distribution which occurs in the structural manner, it is possible to reduce the potential gradient on the insulating-substance sample surface, and thereby to eliminate one of the factors for the beam drift. Actually, however, none of the problems can be solved unless some countermeasure is taken against the potential variation on the sample surface caused by the accumulation of the electrification charges which are induced when irradiating the electron beam onto the insulating-substance sample.

Hereinafter, the explanation will be given below concerning embodiments of a control method for the electrification charges.

According to the present invention, even if the electrification is induced on the surface of the insulating-substance sample 11 by the irradiation with the primary electron beam, a positive voltage which is equal to a few V to a few tens of V relative to the sample surface potential has been already applied to the control electrode 10 so that the induced electrification will not be accumulated in excess. Consequently, even if the accumulation of the electrification charges has been developed, the development will be stopped with an electrification quantity which is lower than the potential difference between the control electrode 10 and the surface of the sample 11. As a result, it becomes possible to limit the initial accumulation of the electrification charges down to the electrification quantity in which the electrification charges can be reduced enough by the self-relaxation effect on the electrification. In the present embodiment, if a quart wafer is selected as the sample, the preferable voltage applied to the control electrode 10 is equal to about 50 V relative to the sample surface potential.

Furthermore, the electrification, which has been induced on the sample by the irradiation with the primary electron beam, exhibits the above-described tendency to be settled down to the constant electrification quantity by the self-relaxation effect in elapsed time. It is highly unlikely, however, that the secondary electrons generated from the electrified area will be fed back to only the electrified area uniformly. Accordingly, the electrification quantity cannot be said to be small enough yet, and the charge distribution within the area is still in the nonuniform state. At this point-in-time, however, in the voltage already set to the control electrode 10, the potential barrier directly above the electrified area (which was described in [Problem to be solved by the Invention] as well) has become small enough down to a degree that the secondary electrons can pass therethrough.

FIG. 6A, FIG. 6B, FIG. 7A, and FIG. 7B illustrate the above-described phenomena. These are about the case where the irradiation area of the primary electron beam is equal to about 70 μm per side. FIG. 6A illustrates an equipotential-line distribution at the time when the initial voltage applied to the control electrode 10 is set at −1610 V, and the retarding voltage is set at −1700 V. The incident energy of the primary electron beam at this time becomes equal to about 1 KeV, where δ is slightly larger than 1. When the primary electron beam has been irradiated on the insulating-substance sample 11, positive charges equal to a few V to a few tens of V are swiftly electrified on an electrified area 42 which substantially coincides with the irradiation area of the primary electron beam. Then, the resultant equipotential-line distribution turns out to become a distribution like an equipotential-line group 41. FIG. 6B is a diagram acquired by locally enlarging the electrified area 42 in FIG. 6A, where the equipotential-line interval is equal to 1V. A potential barrier 44, which is negative with reference to the electrification potential, will be formed directly above the electrified area 42. As a result, the following self-relaxation effect will occur: Namely, about 2-eV secondary electrons, which are the most common of the secondary electrons' energy distribution, are caused to be fed back by the potential barrier 44, thereby re-entering a proximity to the electrified area 42 then to cancel out the positive electrification charges.

FIG. 7A and FIG. 7B illustrate the state where the electrification quantity has been reduced by the self-relaxation effect in FIG. 6A and FIG. 5B. The reduction in the electrification quantity changes the equipotential-line distribution into a distribution like an equipotential-line group 45 in FIG. 7A. When watching the equipotential-line group 45 locally, the equipotential-line group 45 is changed to a distribution like an equipotential-line group 48 as illustrated in FIG. 7B. Namely, the potential barrier directly above the electrified area 46 is relaxed. Consequently, the about 2-eV low-energy secondary electrons 47 are accelerated in the electron source 1's direction, thereby becoming capable of being detected by the secondary-electron detector 13. This phenomenon also coincides with a phenomenon that, immediately after the primary electron beam irradiation on the sample 11, brightness of the SEM image is decreased instantaneously, and becomes brighter once again.

Also, the potential stabilization on the electrified portion by this self-relaxation effect usually requires a long-time electron beam irradiation which ranges from a few tens of seconds to a few minutes, although it depends on the irradiation current quantity as well. However, here, the voltage applied to the control electrode 10, while irradiating the primary electron beam, is changed to a negative voltage which is equal to a few V to a few tens of V relative to the initial voltage value. This makes it possible to intentionally generate a potential barrier on the electrified area which remains nonuniform, thereby allowing the secondary electrons to be fed back to the electrified area. Accordingly, it becomes possible to stabilize the electrification quantity by reducing the electrification quantity down to a degree that the magnification error presents no problem. This allows the potential gradient to be eliminated over a wide range in cooperation with the effects by the control electrode 10 and the sample stage 12 described earlier. Moreover, there will occur none of the unstable displacement of the charges caused by the potential gradient. This makes it possible to form a potential-stabilized area on the insulating-substance sample surface. As a result, there exist no hindrance factors for the secondary electrons. Consequently, it becomes possible to acquire an excellent-S/N-ratio SEM image, and to eliminate the beam drift of the primary electron beam.

It is important, however, that the voltage change in the control electrode 10 be made in a continuous manner or a step-by-step manner. The reason for this condition is as follows: On account of this condition, in the process where the potential barrier is being gradually formed by the voltage change, quantity of the secondary electrons having the energy which allows the electrons to be fed back to the sample, and positions at which these secondary electrons are fed back to the sample also change gradually. This also allows the electrification quantity to be relaxed in a continuous manner. Accordingly, unlike the case where an instantaneous switching of the voltage change is performed, there will occur none of steep charges' concentration gradient or steep potential gradient. This permits diffusion of the charges to be suppressed down to the smallest possible degree, thereby making it possible to perform the stabilization of the electrification swiftly.

It is possible to illustrate the above-described process as is illustrated in FIG. 8A, FIG. 8B, FIG. 9A, and FIG. 9B. In the state illustrated in FIG. 8A and FIG. 8B, since there still exits much of the electrification quantity, an unexpected maladjustment occurs in the diffusion caused by the charges' concentration gradient or the length-measurement magnification. Then, the voltage applied to the control electrode 10 is changed by about −20 V from the initial voltage value. As illustrated in FIG. 8B, this voltage change allows an about 1-V potential barrier 52 to be re-formed directly above an electrified area 49 in FIG. 8A. As a result, secondary electrons having energy lower than about 1 eV are caused to be fed back to the electrified area 49. This reduces the electrification charges even further.

The self-relaxation effect at the steps in FIG. 8A and FIG. 8B reduces the charges on an electrified area 54 in FIG. 9A. Accordingly, the equipotential-line distribution is planarized in proximity to the sample like an equipotential-line group 53. As illustrated in FIG. 9B, even when watching the electrified area 54 locally, no potential barrier exists against low-energy secondary electrons 55 in an equipotential-line group 56. Accordingly, it becomes possible to detect the secondary electrons with an excellent S/N ratio. Moreover, since there exists almost no potential gradient on the primary electron beam irradiation area, there occurs no large displacement of the electrification charges. Also, the electrification quantity is small. These conditions result in no occurrence of the beam drift of the primary electron beam.

FIG. 10 schematically illustrates the relationship between the voltage applied to the control electrode 10 and the electrification quantity induced on the sample 11 when the control-electrode voltage 10 is changed. The A area in FIG. 10 corresponds to a time-zone within which not a long time has elapsed since the irradiation on the sample 11 with the primary electron beam. Here, as is indicated by a graph 38, the positive electrification will be developed swiftly, and thus the electrification quantity will also be increased swiftly. The voltage applied to the control electrode 10 remains an initial value 35, and the SEM image becomes darker.

In the B area corresponding to a time-zone up to which a further time has elapsed, as is indicated by a graph 39, the electrification quantity will be reduced by the self-relaxation effect. The voltage applied to the control electrode 10 remains the initial value 35, and the SEM image becomes brighter. However, even if the voltage applied to the control electrode 10. is maintained at the initial value 35, the electrification quantity will be reduced as is indicated by the graph 39. As a result, it takes quite a long time until the electrification quantity has been stabilized, and the beam drift will not be settled down.

In the C area, the voltage applied to the control electrode 10 is changed in a continuous manner as is indicated by a graph 36, or in a step-by-step manner where the change is divided into several parts or times as is indicated by a graph 37. This change allows the electrification quantity to be reduced swiftly as is indicated by a graph 40, thereby making it possible to stabilize the electrification quantity in a short time. At this time, the SEM image becomes brighter after it has become darker to some extent.

If the voltage applied to the control electrode 10 is controlled as is illustrated in FIG. 10, the following operation is conceivable: Namely, it becomes possible to automatically terminate the voltage change in the control electrode 10 by detecting the brightness change in the SEM image or the secondary-electron current quantity. Also, in some cases, the electrification quantity differs depending on the type or configuration of the sample, and thus detection quantity of the secondary electrons decreases. Accordingly, the initial value of the voltage applied to the control electrode 10 has a possibility of being able to be changed. Consequently, it is evident that it becomes possible to automatically determine the optimum initial value by sweeping the voltage applied to the control electrode 10 over a wide range using basically the same methodology.

When trying to detect the brightness change in the SEM image or the secondary-electron current quantity, concretely, the following method is simple and convenient: Namely, the voltage applied to the control electrode 10 is changed while irradiating the primary electron beam, then determining the relationship between digital gradation of the SEM images grabbed on each constant time-period basis and the pixel number belonging thereto. If the gradation and the pixel number become larger or smaller than threshold values determined in advance, it is possible to terminate the voltage change in the control electrode 10, or it is possible to use the electrode voltage at that time as the initial value of the voltage applied to the control electrode 10.

Now, as having been explained previously, the beam drift refers to the phenomenon that the orbit of the primary electron beam undergoes the deflection effect by the potential gradient in proximity to the sample surface. Here, this force field is formed by the potential difference between the primary electron beam irradiation area and its peripheral portion. Accordingly, the following condition is important: Namely, the potential gradient which becomes the cause for formation of the force field is made uniform in a range which is sufficiently wider than a high-magnification charged particle beam irradiation area where the length-measurement is to be performed (e.g., a few μm per side).

As described earlier, there has existed the following method: The voltage to be applied to the flat-plate electrode is changed from the initial value to the negative voltage which is equal to a few V to a few tens of V, thereby reducing the electrification quantity and eliminating the potential gradient simultaneously. From the importance of the uniformity, in the case of using this method, it is effective that the length-measurement with the high magnification set thereto be performed after this method has been carried out with the low magnification set in advance.

If the above-described solving methods are employed and applied to the first and second problems described in [Problem to be solved by the Invention], it turns out that the voltage applied to the control electrode 10 causes a deceleration potential to occur against the primary charged particle beam within the lens field between the objective lens and the sample. The higher the energy of the primary charged particle beam becomes which will pass through within the lens field, the more capable it becomes to reduce the chromatic aberration of the lens. Accordingly, it becomes important to locate the control electrode 10 in a manner of being made as close as possible to the sample surface.

In the control electrode 10, however, there is provided the hole through which the primary electron beam can pass. As a result, as described earlier, there exists the possibility that the potential's penetration from the hole will cause the potential gradient to occur on the sample surface. Accordingly, it is impossible to make the distance between the control electrode 10 and the sample 11 arbitrarily close. Typically, the degree of this potential's penetration can be considered to be an order of the radius of the hole. Also, the electric-field simulation has indicated that the potential gradient on the sample surface can be reduced enough if the relation between the diameter D of the hole and the distance L between the flat-plate electrode and the sample satisfies $D/L \leq 1.5$. Consequently, a method for solving the third problem is as follows: The diameter of the hole is set at D, which satisfies the above-described relation with respect to L that allows the lens aberration to be reduced to satisfy the performance of the device.

The above-described description has been given concerning the embodiments. To those who are skilled in the art, however, it is apparent that the present invention is not limited thereto, and that various modifications and amendments can be made within scopes of the spirit of the present invention and the scope of the appended claims.

Figure 1:
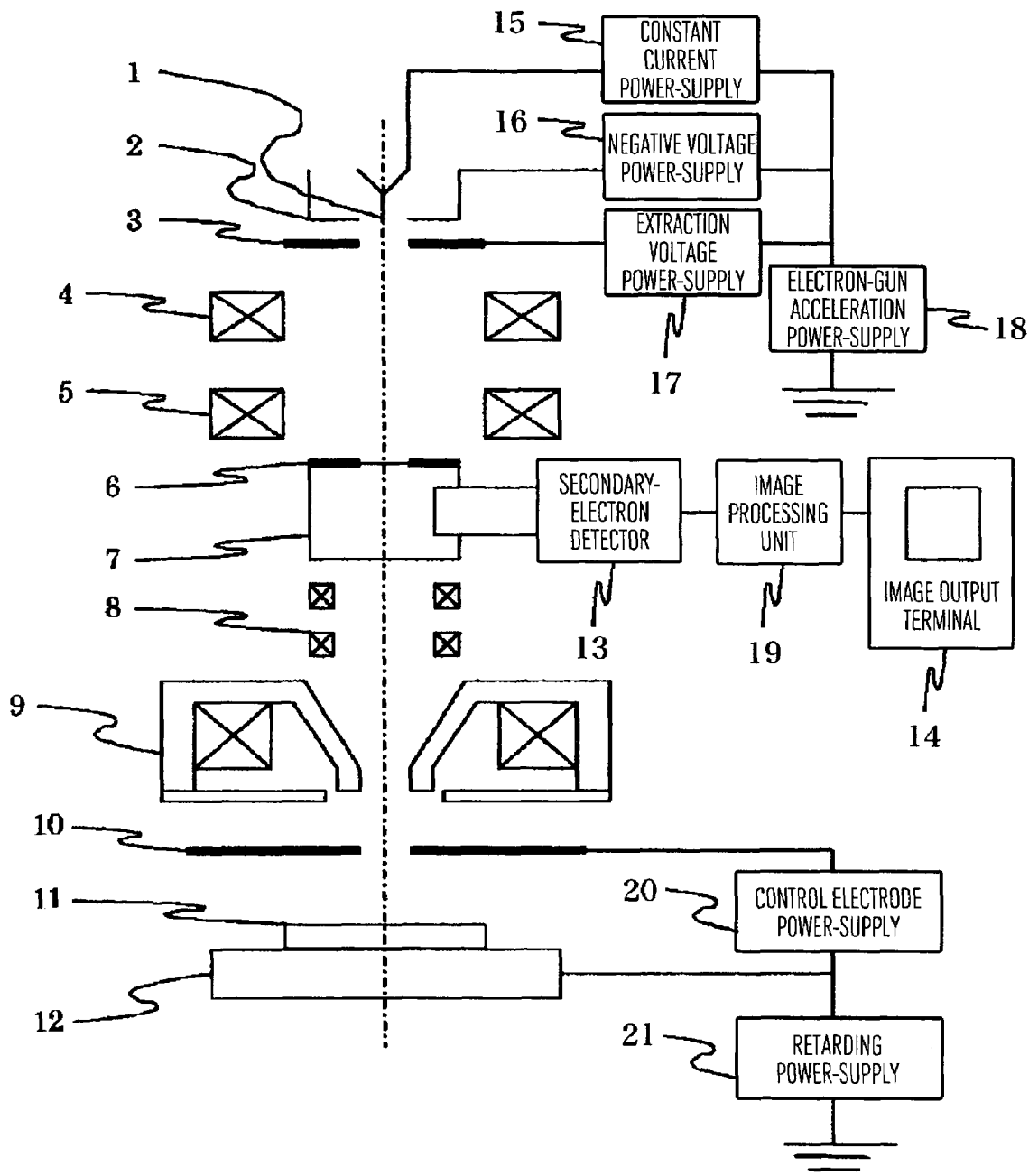
[FIG. 1]
This is the entire diagram of the embodiment of the present invention.
Figure 2:
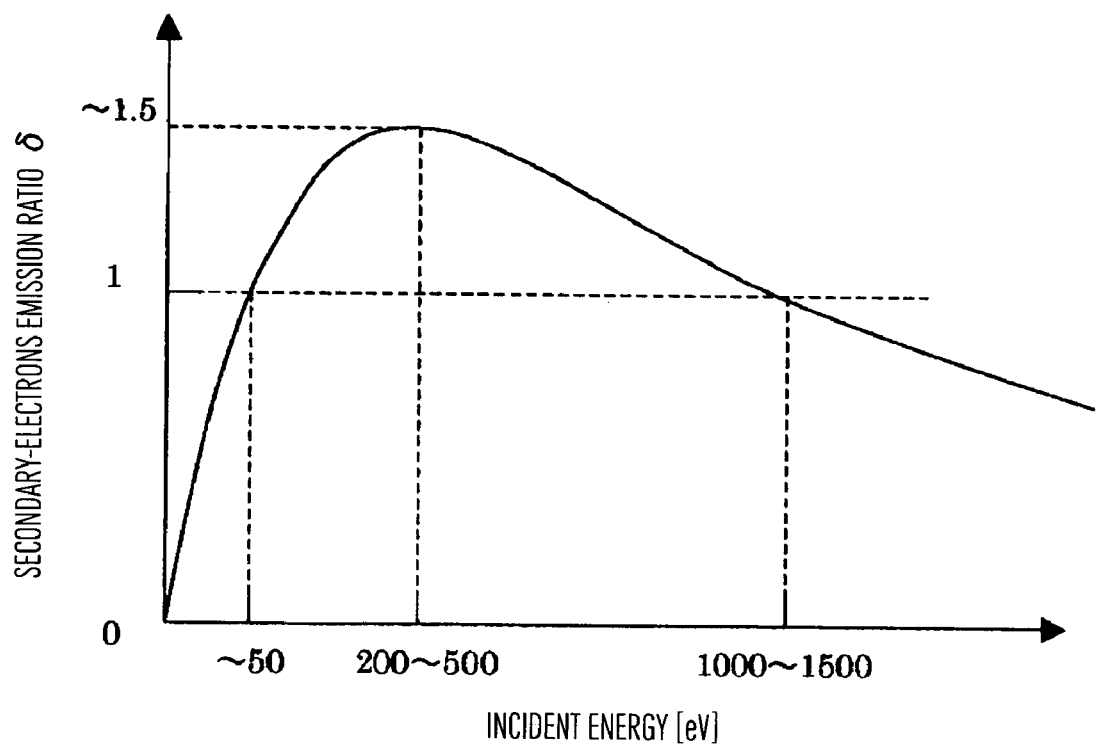
[FIG. 2]
This is the relationship between the secondary-electrons emission ratio and the incident energy.
Figure 3A:
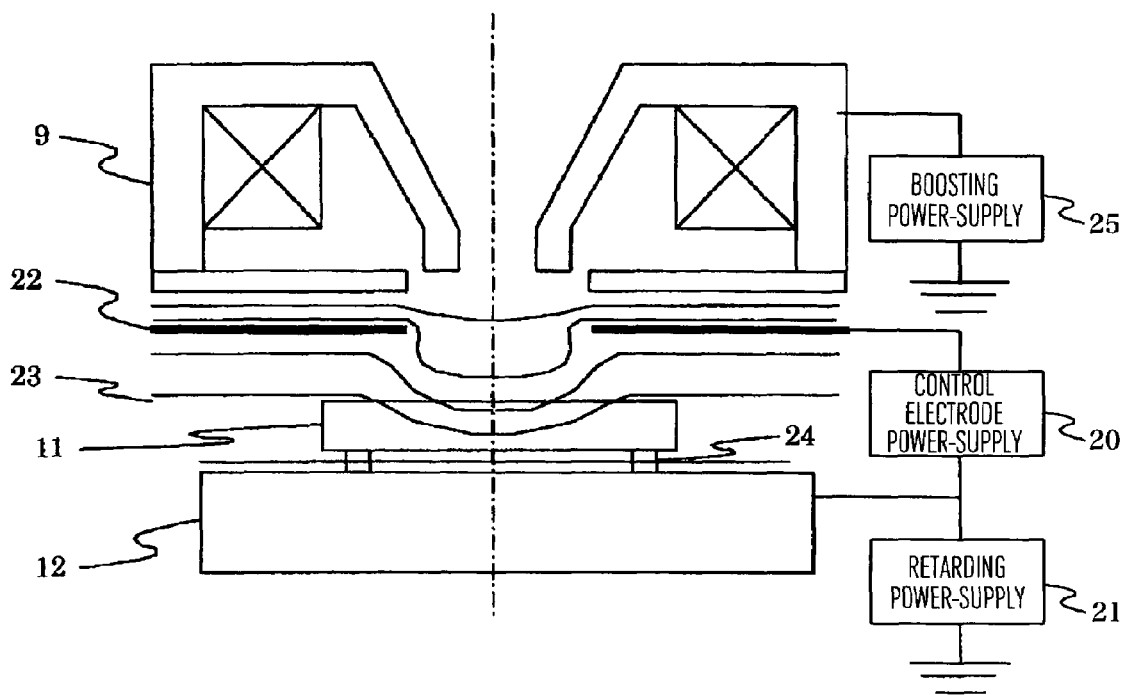
[FIG. 3A]
This is the example of configuration of the control electrode and that of the equipotential-line distribution for explaining the effects of the present invention.
Figure 3B:
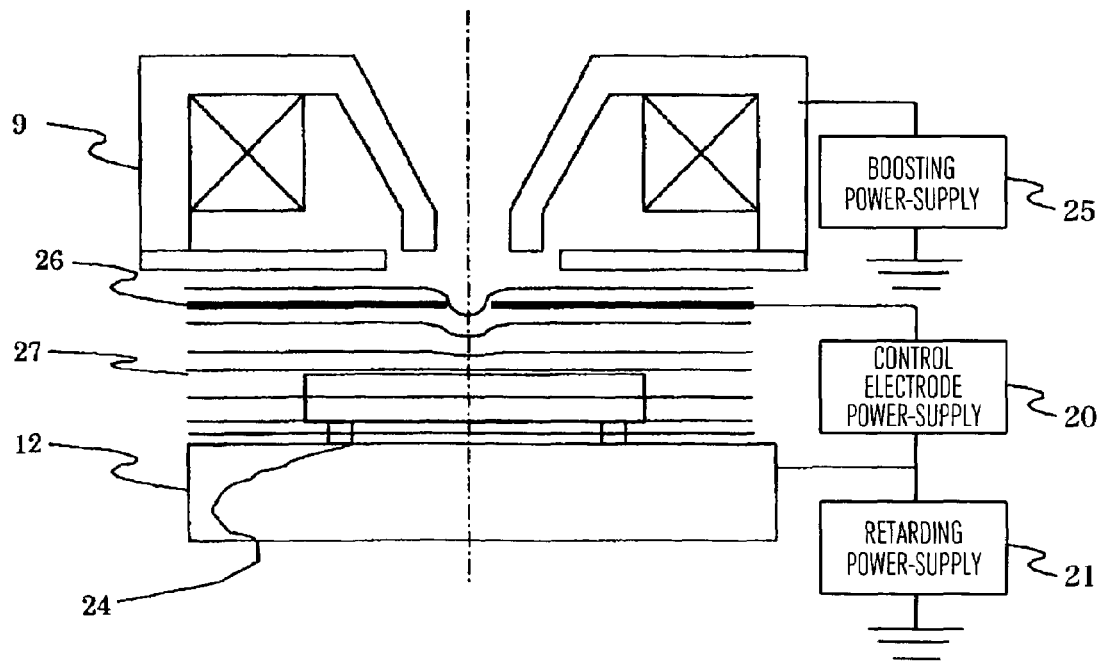
[FIG. 3B]
This is the example of configuration of the control electrode and that of the equipotential-line distribution for explaining the effects of the present invention.
Figure 4A:
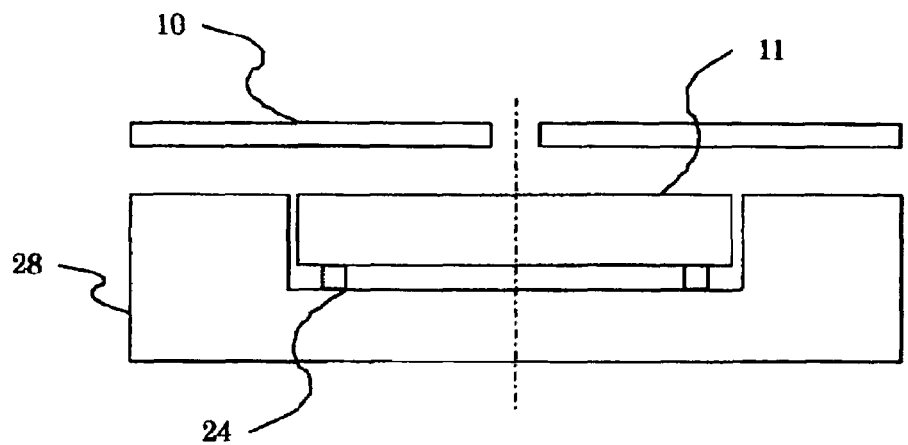
[FIG. 4A]
This is the example of the cross-sectional diagram of the sample stage and the sample including the control electrode.
Figure 4B:
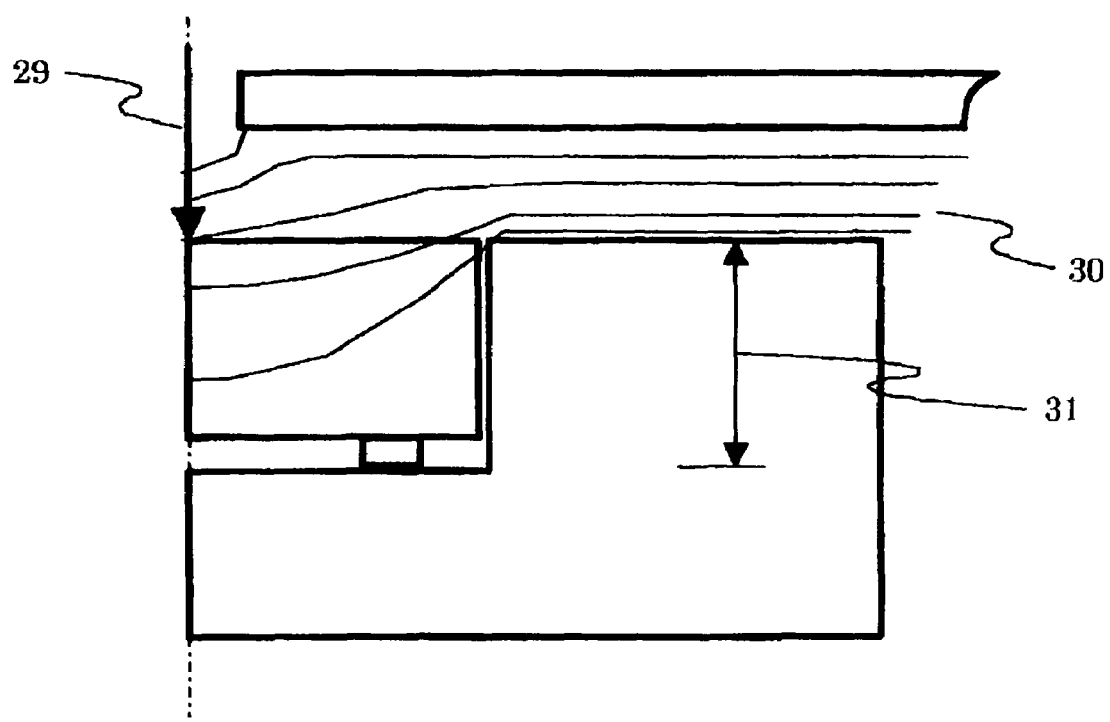
[FIG. 4B]
This is the example of the equipotential-line distribution at the sample end-portion.
Figure 5A:
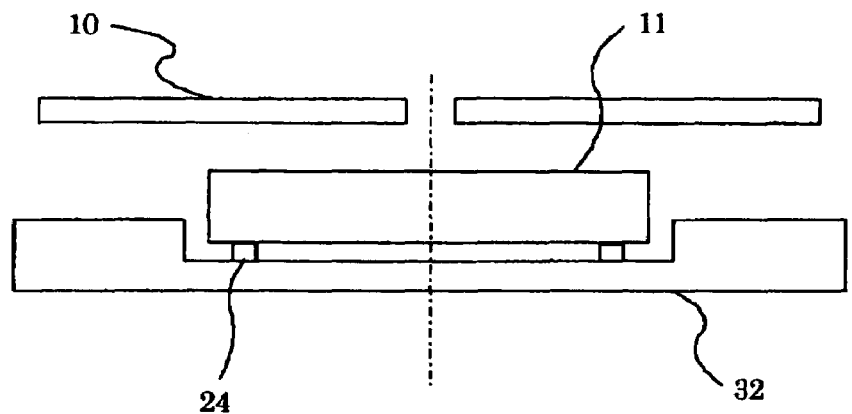
[FIG. 5A]
This is the example of the cross-sectional diagram of the sample stage and the sample including the control electrode.
Figure 5B:
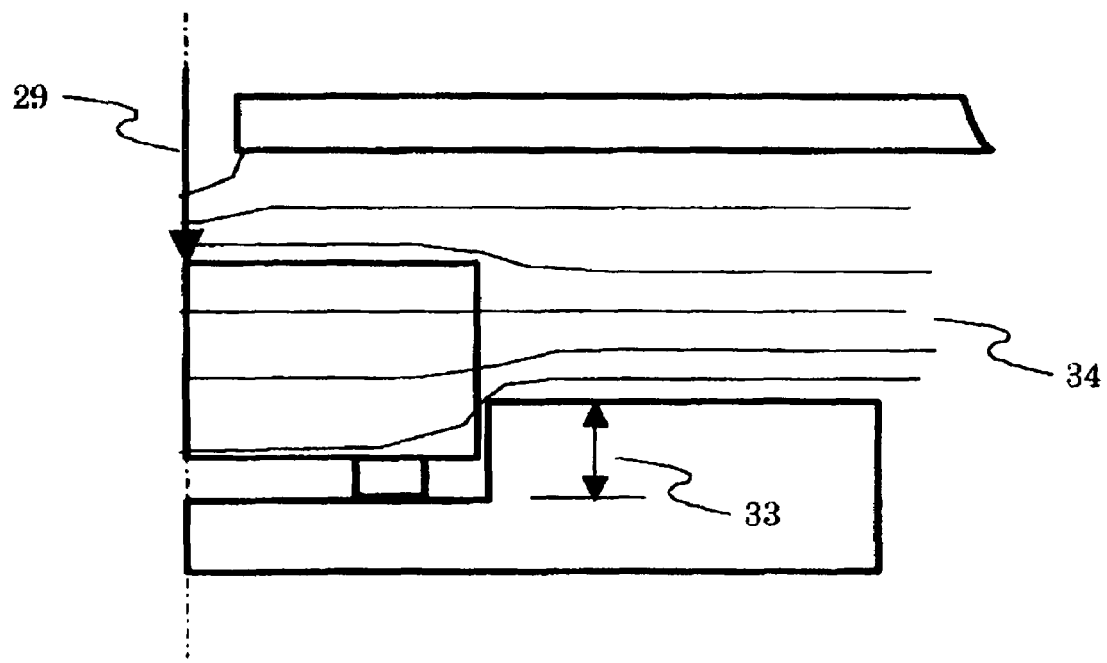
[FIG. 5B]
This is the example of the equipotential-line distribution at the sample end-portion.
Figure 6A:
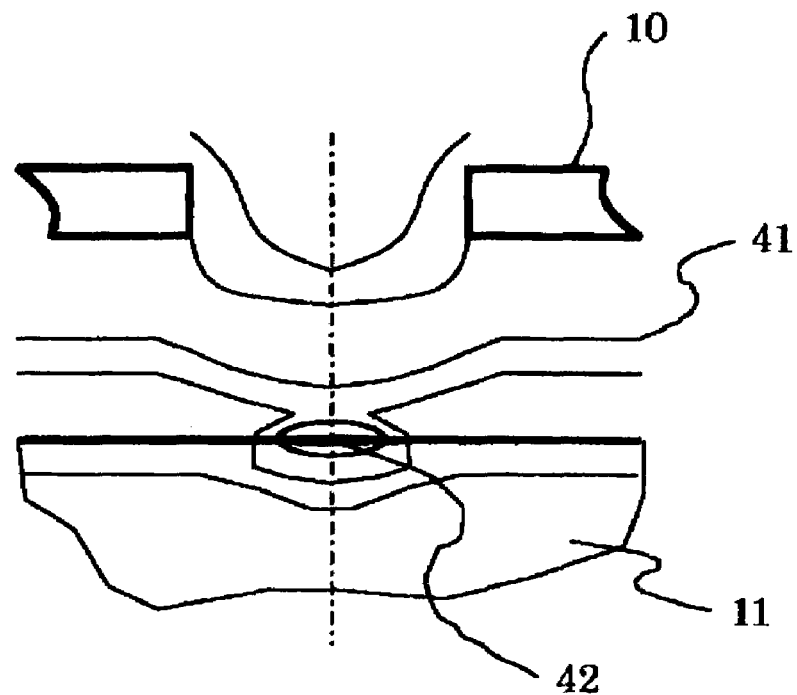
[FIG. 6A]
This is the equipotential-line distribution in the near-initial state at the time when the sample surface is electrified.
Figure 6B:
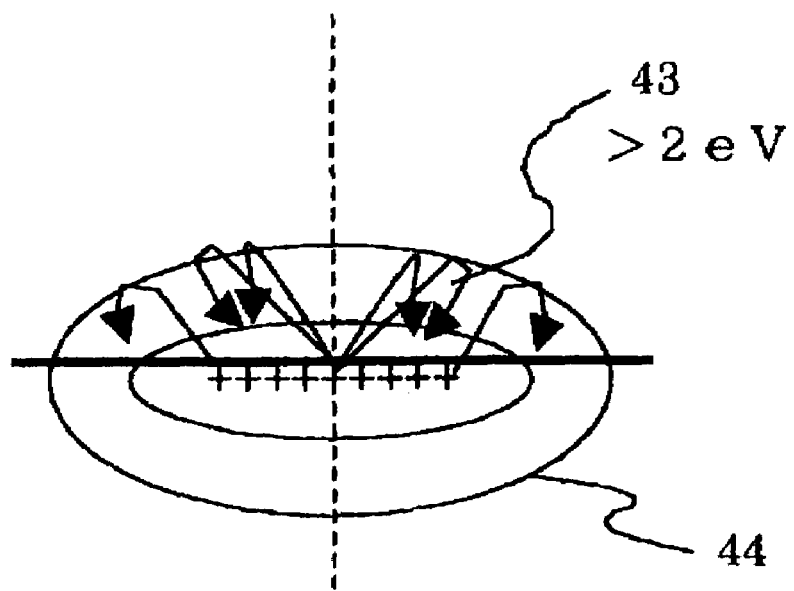
[FIG. 6B]
This is the schematic diagram of the local potential barrier in the electrified portion, and the manner in which the secondary electrons are being fed back to the sample.
Figure 7A:
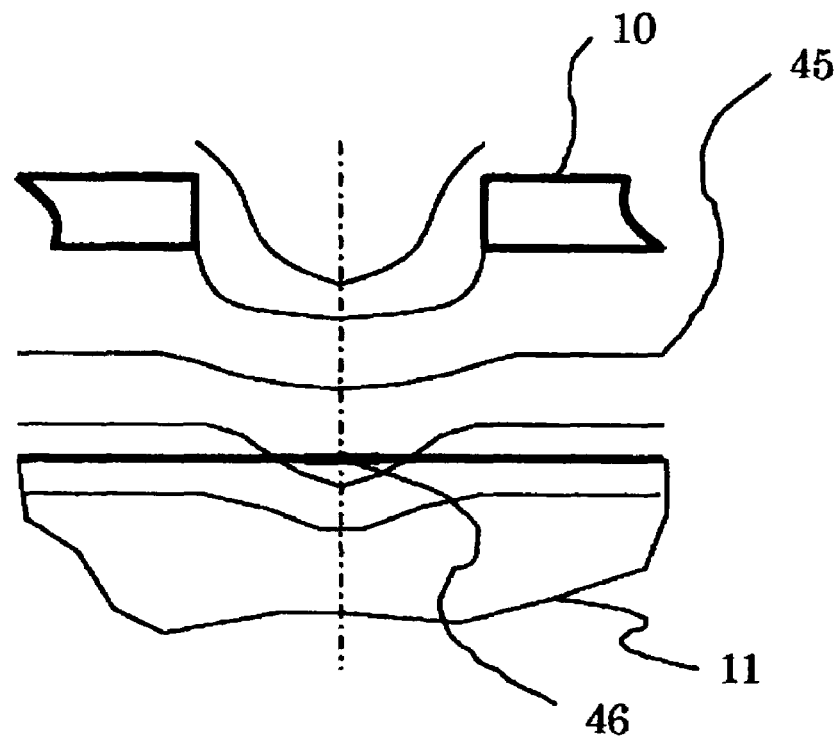
[FIG. 7A]
This is the equipotential-line distribution in the state where the electrification on the sample is decreased after the steps in FIG. 6A and FIG. 6B.
Figure 7B:
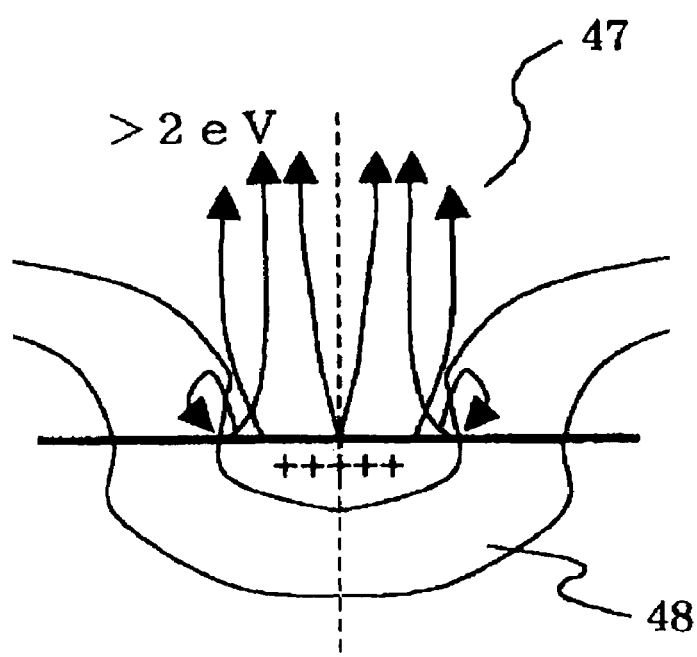
[FIG. 7B]
This is the schematic diagram of the manner in which the local potential barrier in the electrified portion is reduced, and in which the secondary-electron quantity which is going to be fed back to the sample is being decreased.
Figure 8A:
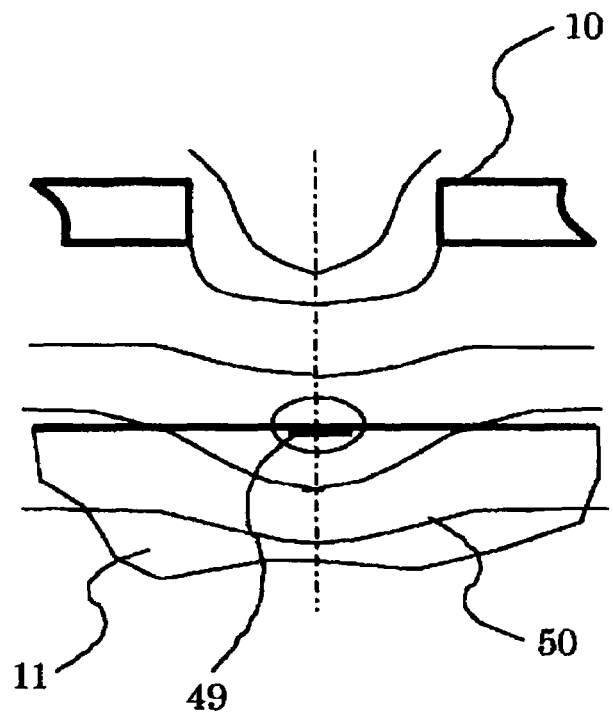
[FIG. 8A]
This is the equipotential-line distribution at the time when the potential barrier is re-formed in the electrified area by changing the voltage of the control electrode from the initial value into the negative direction.
Figure 8B:
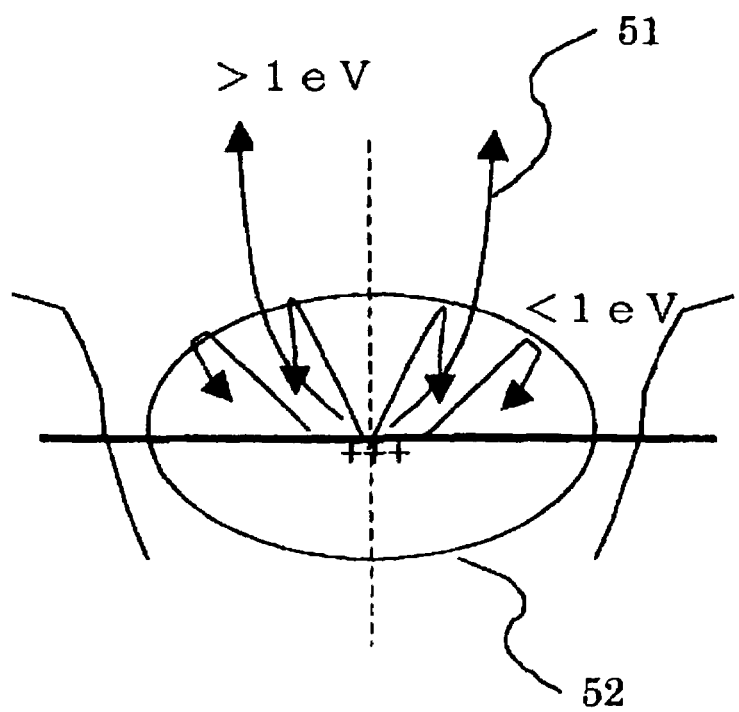
[FIG. 8B]
This is the schematic diagram of the local potential barrier in the electrified portion, and the manner in which the secondary electrons are being fed back to the sample.
Figure 9A:
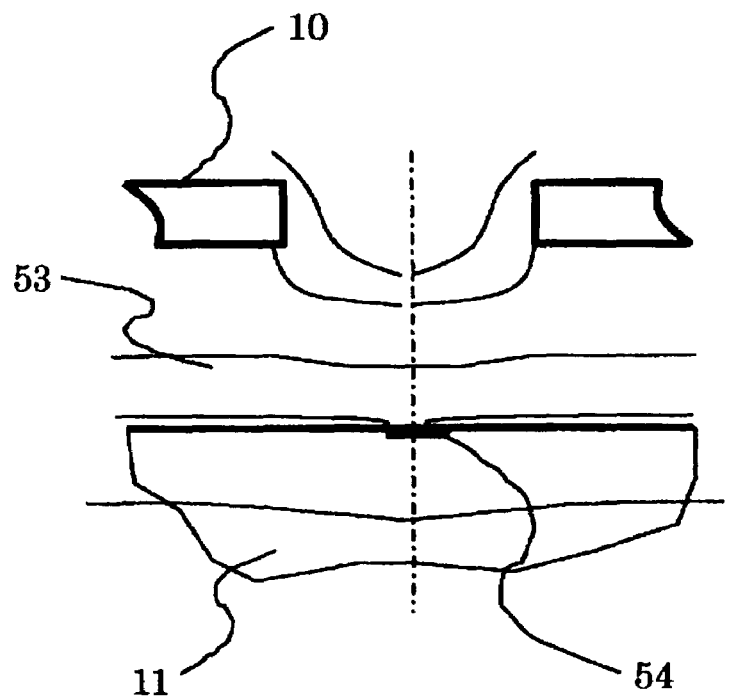
[FIG. 9A]
This is the equipotential-line distribution in the state where the electrification on the sample is decreased after the steps in FIG. 8A and FIG. 8B.
Figure 9B:
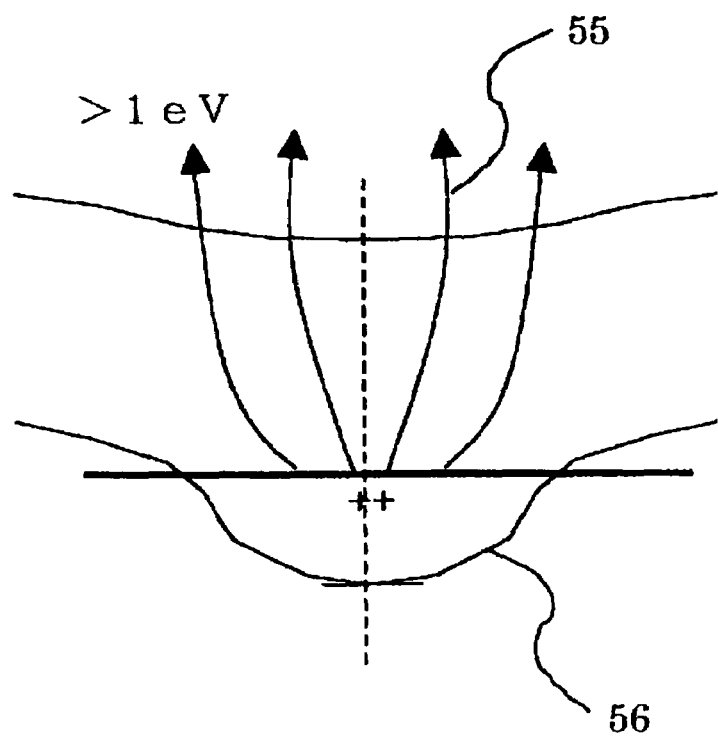
[FIG. 9B]
This is the schematic diagram of the manner in which the local potential barrier in the electrified portion is vanished, and in which the secondary-electron quantity which is going to be fed back to the sample is being disappearing.
Figure 10:
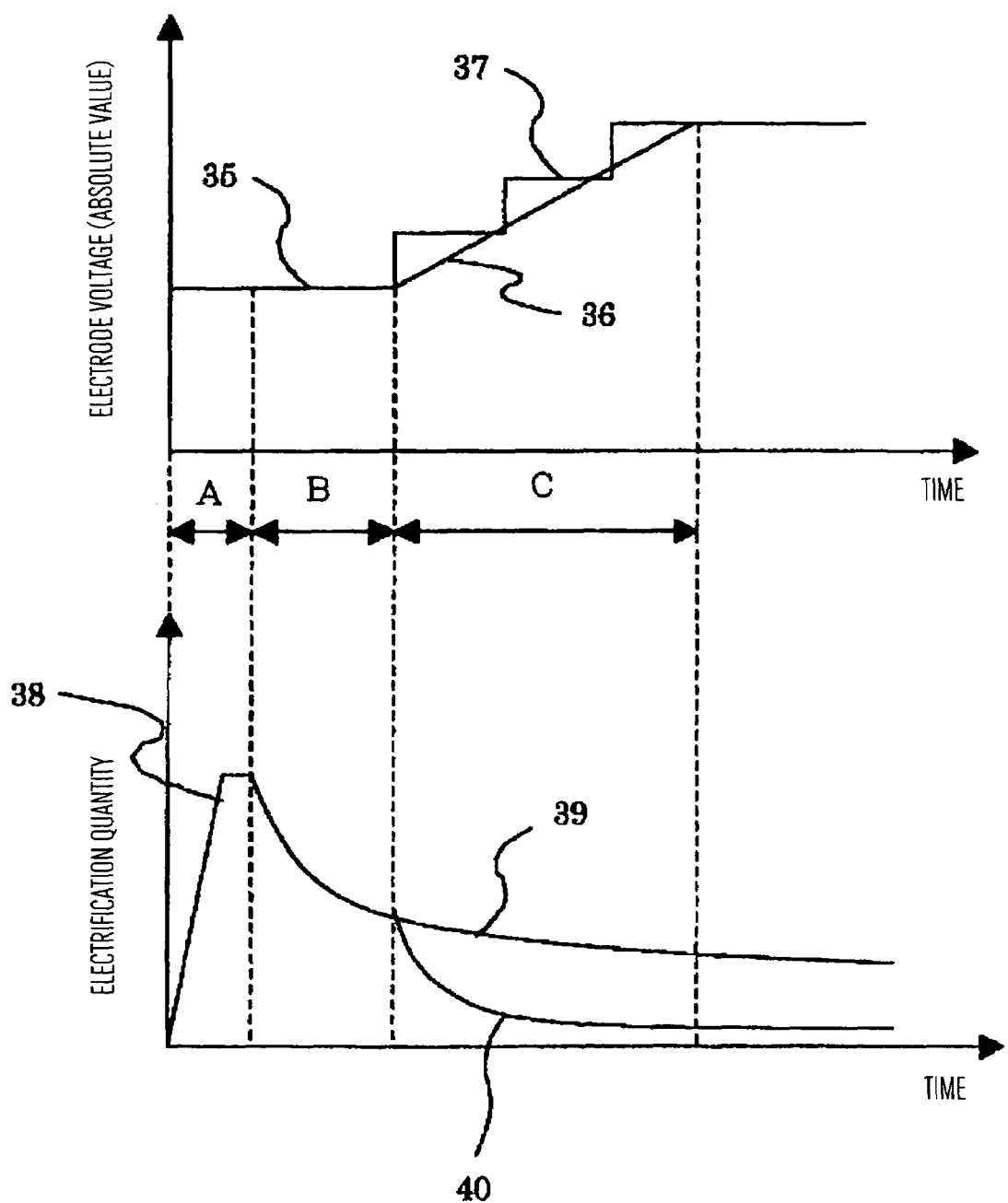
[FIG. 10]
This is the control method for the control-electrode voltage and, the relationship between the control-electrode voltage and the electrification quantity on the sample surface in response to the control-electrode voltage change.

DESCRIPTION OF REFERENCE NUMERALS 1 electron source
2 suppression electrode
3 extraction electrode
4 magnetic-field lens
5 magnetic-field lens
6 conversion electrode
7 EXB filter
8 deflection coil
9 objective lens
10 control electrode
11 sample
12 sample stage
13 secondary-electron detector
14 image output terminal
15 constant current power-supply
16 power-supply
17 extraction voltage power-supply
18 electron-gun acceleration power-supply
19 image processing unit
20 control electrode power-supply
21 retarding power-supply
22 control electrode
23 equipotential-line distribution
24 support stages
25 boosting power-supply
26 control electrode
27 equipotential-line group
28 sample stage
29 primary electron beam
30 equipotential-line group
31 dimension
32 sample stage
33 dimension
34 equipotential-line group
35 control-electrode voltage initial value
36 graph for control-electrode voltage control
37 graph for control-electrode voltage control
38 graph for electrification-quantity change
39 graph for electrification-quantity change
40 graph for electrification-quantity change
41 equipotential-line group
42 electrified area
43 secondary electrons
44 equipotential lines representing potential barrier
45 equipotential-line group
46 electrified area
47 secondary electrons
48 equipotential-line group
49 electrified area
50 equipotential-line group
51 secondary electrons
52 equipotential lines representing potential barrier
53 equipotential-line group
54 electrified area 55 secondary electrons
56 equipotential-line group

The invention claimed is:

1. A scanning electron microscope, comprising:
an electrode which is located under an objective lens, and to which a voltage can be applied independently, and
a sample stage which is located under said electrode, and to which a voltage can be applied independently, said sample stage being used for mounting a sample thereon,
wherein said sample is set up between said electrode and said sample stage such that an arbitrary equipotential surface and the surface of said sample coincide with each other, said arbitrary equipotential surface being formed by a parallel electric potential, said parallel electric potential being generated between said electrode and said sample stage by applying each of said voltages to said electrode and said sample stage.

2. The scanning electron microscope according to claim 1, wherein said sample is a sample whose substrate is formed of an insulating substance, said insulating substance being exposed on a part or the whole of said surface of said sample.

3. The scanning electron microscope according to claim 1, wherein said electrode is a flat-plate electrode having a hole through which an electron beam can pass, said hole provided in said flat-plate electrode being of a size which prevents a potential over said flat-plate electrode from being substantially exerted on said sample surface, relationship between D and L satisfying $D/L \leq 1.5$ when letting diameter of said hole be D and distance between said flat-plate electrode and said sample be L.

4. The scanning electron microscope according to claim 1, wherein said sample stage is larger than area of said sample.

5. The scanning electron microscope according to claim 1, wherein said sample stage is geometrically similar to shape of said sample.

6. The scanning electron microscope according to claim 1, wherein the upper surface of said sample stage or a specific surface thereof on which said sample is mounted is formed into a structure, said structure being planarized over an area larger than said sample and having no projections and depressions within said surface, said upper surface or said specific surface being a surface which is directly opposed to the bottom surface of said sample.

7. The scanning electron microscope according to claim 1, wherein depth of an excavated structure or height of a spacing structure is smaller than one-half of thickness of said sample, said excavated structure or said spacing structure being provided in said sample stage so as to mount said sample therein or thereon.

8. A sample observation method, comprising a step of, when said sample whose substrate is formed of an insulating substance such as glass or quartz is observed in said scanning electron microscope according to claim 1, setting a voltage which is to be applied to said electrode, at a voltage which becomes positive with reference to a potential on said sample stage, and which becomes positive by a few V to a few tens of V with reference to a potential on said sample surface.

9. The sample observation method according to claim 8, further comprising a step of changing said voltage, which has been applied to said electrode, in a range in a continuous manner or in a step-by-step manner in the midst of irradiating an electron beam onto said sample, said range ranging from a few V to a few tens of V in a direction which is negative with reference to said initial value of said voltage.

10. The sample observation method according to claim 9, wherein an irradiation area of said electron beam on said sample in the midst of changing said voltage applied to said electrode is sufficiently larger as compared with an area to be observed.

11. A scanning electron microscope capable of automatically changing said voltage applied to said electrode in said sample observation method according to claim 9, said scanning electron microscope, comprising means for measuring secondary-electron quantity or reflected-electron quantity generated from said sample, wherein, if said secondary-electron quantity or said reflected-electron quantity has become larger or smaller than threshold values determined in advance, said scanning electron microscope automatically terminates said change in said voltage applied to said electrode, and sets said voltage at that time as said initial value of said voltage.

12. A scanning electron microscope, comprising means for measuring secondary-electron quantity or reflected-electron quantity generated from said sample in said sample observation method according to claim 9, wherein, if said secondary-electron quantity or said reflected-electron quantity has become larger or smaller than threshold values determined in advance, said scanning electron microscope automatically terminates said change in said voltage applied to said electrode.

13. The scanning electron microscope according to claim 11, wherein said threshold values according to claim 11 are specific luminance of an image and number of pixels belonging to said specific luminance, said image being formed based on secondary-electron signals or reflected-electron signals.

14. The scanning electron microscope according to claim 12, wherein said threshold values are specific luminance of an image and number of pixels belonging to said specific luminance, said image being formed based on secondary-electron signals or reflected-electron signals.

15. The scanning electron microscope according to claim 12, wherein said means according to claim 12 for measuring said secondary-electron quantity or said reflected-electron quantity is an electron detector, said electron detector being a Wien filter including an electric field and a magnetic field, or a potential-blockage type energy filter equipped with an electrode, said electrode being capable of generating a potential which turns out to become a barrier against energy possessed by said secondary electrons or said reflected electrons.

* * * * *